(12) United States Patent
Fritzemeier

(10) Patent No.: US 8,927,392 B2
(45) Date of Patent: Jan. 6, 2015

(54) METHODS FOR FORMING CRYSTALLINE THIN-FILM PHOTOVOLTAIC STRUCTURES

(75) Inventor: Leslie G. Fritzemeier, Lexington, MA (US)

(73) Assignee: Siva Power, Inc., San Jose, CA (US)

( * ) Notice: Subject to any disclaimer, the term of this patent is extended or adjusted under 35 U.S.C. 154(b) by 1029 days.

(21) Appl. No.: 12/262,731

(22) Filed: Oct. 31, 2008

(65) Prior Publication Data

US 2009/0117679 A1 May 7, 2009

Related U.S. Application Data

(60) Provisional application No. 60/984,796, filed on Nov. 2, 2007.

(51) Int. Cl.
| | |
|---|---|
| *H01L 21/30* | (2006.01) |
| *H01L 33/00* | (2010.01) |
| *H01L 31/0304* | (2006.01) |
| *H01L 31/0392* | (2006.01) |
| *H01L 31/0693* | (2012.01) |
| *H01L 31/18* | (2006.01) |
| *H01L 21/02* | (2006.01) |
| *H01L 33/12* | (2010.01) |
| *H01S 5/02* | (2006.01) |

(52) U.S. Cl.
CPC .......... *H01L 33/007* (2013.01); *H01L 31/0304* (2013.01); *H01L 31/0392* (2013.01); *H01L 31/0693* (2013.01); *H01L 31/1852* (2013.01); *H01L 21/02367* (2013.01); *H01L 21/02491* (2013.01); *H01L 21/02505* (2013.01); *H01L 21/02521* (2013.01); *H01L 33/12* (2013.01); *H01S 5/0215* (2013.01); *Y02E 10/544* (2013.01)

USPC .............................. 438/458; 438/93; 438/478

(58) Field of Classification Search
USPC ............ 438/46, 47, 57, 71, 93, 94, 464, 478, 438/584, 455, 45
See application file for complete search history.

(56) References Cited

U.S. PATENT DOCUMENTS

| | | |
|---|---|---|
| 3,372,069 A | 3/1968 | Bailey et al. |
| 4,128,733 A | 12/1978 | Fraas et al. |
| 4,165,558 A | 8/1979 | Armitage, Jr. et al. |
| 4,227,942 A | 10/1980 | Hall |
| 4,321,099 A | 3/1982 | Frosch et al. |

(Continued)

FOREIGN PATENT DOCUMENTS

| | | |
|---|---|---|
| EP | 1 109 230 | 6/2001 |
| EP | 1 469 528 | 10/2004 |

(Continued)

OTHER PUBLICATIONS

International Preliminary Report on Patentability for PCT/US2006/033115, mailed Mar. 6, 2008.

(Continued)

*Primary Examiner* — Fernando L Toledo
*Assistant Examiner* — Bryan Junge
(74) *Attorney, Agent, or Firm* — Morgan, Lewis & Bockius LLP

(57) ABSTRACT

Methods for forming semiconductor devices include providing a textured template, forming a buffer layer over the textured template, forming a substrate layer over the buffer layer, removing the textured template, thereby exposing a surface of the buffer layer, and forming a semiconductor layer over the exposed surface of the buffer layer.

30 Claims, 3 Drawing Sheets

(56) References Cited

U.S. PATENT DOCUMENTS

| | | |
|---|---|---|
| 4,332,974 A | 6/1982 | Fraas |
| 4,392,297 A | 7/1983 | Little |
| 4,400,244 A | 8/1983 | Kroger et al. |
| 4,514,583 A | 4/1985 | Izu et al. |
| 4,530,739 A | 7/1985 | Hanak et al. |
| 4,704,624 A | 11/1987 | Yamazaki et al. |
| 4,707,216 A | 11/1987 | Morkoc et al. |
| 4,774,194 A | 9/1988 | Hokuyou et al. |
| 4,808,462 A | 2/1989 | Yaba et al. |
| 4,981,525 A | 1/1991 | Kiyama et al. |
| 5,136,351 A | 8/1992 | Inoue et al. |
| 5,156,995 A | 10/1992 | Fitzgerald, Jr. et al. |
| 5,231,047 A | 7/1993 | Ovshinsky et al. |
| 5,254,481 A | 10/1993 | Nishida |
| 5,279,679 A | 1/1994 | Murakami et al. |
| 5,403,771 A | 4/1995 | Nishida et al. |
| 5,433,169 A | 7/1995 | Nakamura et al. |
| 5,484,664 A | 1/1996 | Kitahara et al. |
| 5,538,903 A | 7/1996 | Aramoto et al. |
| 5,575,862 A | 11/1996 | Nishida et al. |
| 5,603,764 A | 2/1997 | Matsuda et al. |
| 5,668,050 A | 9/1997 | Iwasaki et al. |
| 5,677,236 A | 10/1997 | Saitoh et al. |
| 5,690,736 A | 11/1997 | Tokunaga et al. |
| 5,824,566 A | 10/1998 | Sano et al. |
| 5,843,811 A | 12/1998 | Singh et al. |
| 5,853,497 A | 12/1998 | Lillington et al. |
| 5,897,331 A | 4/1999 | Sopori |
| 5,913,986 A | 6/1999 | Matsuyama et al. |
| 6,063,996 A | 5/2000 | Takada et al. |
| 6,080,928 A | 6/2000 | Nakagawa et al. |
| 6,121,541 A | 9/2000 | Arya |
| 6,130,380 A | 10/2000 | Nakamura et al. |
| 6,166,319 A | 12/2000 | Matsuyama et al. |
| 6,180,870 B1 | 1/2001 | Sano et al. |
| 6,184,456 B1 | 2/2001 | Matsuyama et al. |
| 6,194,023 B1 | 2/2001 | Mitsuhashi et al. |
| 6,277,714 B1 | 8/2001 | Fonash et al. |
| 6,288,325 B1 | 9/2001 | Jansen et al. |
| 6,331,208 B1 | 12/2001 | Nishida et al. |
| 6,340,788 B1 | 1/2002 | King et al. |
| 6,362,021 B2 * | 3/2002 | Ford et al. ............. 438/97 |
| 6,413,794 B1 | 7/2002 | Sano et al. |
| 6,432,521 B1 | 8/2002 | Yagi et al. |
| 6,482,668 B2 | 11/2002 | Okada et al. |
| 6,525,264 B2 | 2/2003 | Ouchida et al. |
| 6,541,695 B1 | 4/2003 | Mowles |
| 6,548,751 B2 | 4/2003 | Sverdrup, Jr. et al. |
| 6,562,702 B2 | 5/2003 | Yagi et al. |
| 6,562,761 B1 | 5/2003 | Fritzemeier et al. |
| 6,638,838 B1 | 10/2003 | Eisenbeiser et al. |
| 6,645,313 B2 * | 11/2003 | Goyal et al. ............. 148/96 |
| 6,646,293 B2 | 11/2003 | Emrick et al. |
| 6,673,646 B2 | 1/2004 | Droopad |
| 6,730,410 B1 | 5/2004 | Fritzemeier et al. |
| 6,750,394 B2 | 6/2004 | Yamamoto et al. |
| 6,756,289 B1 * | 6/2004 | Nakagawa et al. ............. 438/478 |
| 6,765,240 B2 | 7/2004 | Tischler et al. |
| 6,784,139 B1 | 8/2004 | Sankar et al. |
| 6,815,605 B1 | 11/2004 | Abe et al. |
| 6,869,863 B2 | 3/2005 | Nishida et al. |
| 6,962,873 B1 * | 11/2005 | Park ............. 438/627 |
| 7,038,238 B1 | 5/2006 | Yamazaki et al. |
| 7,067,856 B2 | 6/2006 | Ramdani et al. |
| 7,075,002 B1 | 7/2006 | Yamazaki et al. |
| 7,087,113 B2 | 8/2006 | Goyal |
| 7,115,811 B2 | 10/2006 | Ho et al. |
| 7,122,733 B2 | 10/2006 | Narayanan et al. |
| 7,183,229 B2 | 2/2007 | Yamanaka et al. |
| 7,211,521 B2 | 5/2007 | Mauk |
| 7,256,142 B2 | 8/2007 | Fitzgerald |
| 7,279,632 B2 | 10/2007 | Nakajima et al. |
| 7,288,332 B2 * | 10/2007 | Findikoglu et al. ............. 428/698 |
| 7,339,109 B2 | 3/2008 | Stan et al. |
| 7,342,276 B2 | 3/2008 | Ooms et al. |
| 7,348,259 B2 | 3/2008 | Cheng et al. |
| 2003/0013280 A1 | 1/2003 | Yamanaka |
| 2003/0019519 A1 | 1/2003 | Toyama et al. |
| 2003/0027409 A1 | 2/2003 | Ramdani et al. |
| 2003/0188680 A1 | 10/2003 | Nakagawa et al. |
| 2003/0221718 A1 | 12/2003 | Kubo et al. |
| 2003/0230338 A1 * | 12/2003 | Menezes ............. 136/265 |
| 2004/0245543 A1 * | 12/2004 | Yoo ............. 257/103 |
| 2005/0074915 A1 | 4/2005 | Tuttle et al. |
| 2006/0021565 A1 | 2/2006 | Zahler et al. |
| 2006/0049399 A1 | 3/2006 | Lei et al. |
| 2006/0073978 A1 * | 4/2006 | Chason et al. ............. 505/434 |
| 2006/0115964 A1 | 6/2006 | Findikoglu et al. |
| 2006/0185582 A1 * | 8/2006 | Atwater et al. ............. 117/89 |
| 2007/0044832 A1 * | 3/2007 | Fritzemeier ............. 136/252 |
| 2007/0051302 A1 | 3/2007 | Gosain et al. |
| 2007/0163489 A1 | 7/2007 | Son et al. |
| 2007/0181891 A1 * | 8/2007 | Eisert et al. ............. 257/82 |
| 2007/0215905 A1 | 9/2007 | Kohiro et al. |
| 2007/0235824 A1 | 10/2007 | Rakshit et al. |
| 2007/0261733 A1 | 11/2007 | Hannour et al. |
| 2007/0277873 A1 | 12/2007 | Cornfeld et al. |
| 2007/0277874 A1 | 12/2007 | Dawson-Elli et al. |
| 2008/0023710 A1 * | 1/2008 | Park et al. ............. 257/96 |
| 2008/0050887 A1 * | 2/2008 | Chen et al. ............. 438/455 |
| 2009/0114274 A1 | 5/2009 | Fritzemeier |

FOREIGN PATENT DOCUMENTS

| | | |
|---|---|---|
| WO | WO-85-05221 | 11/1985 |
| WO | WO-90-09039 | 8/1990 |
| WO | WO-91-03583 | 3/1991 |
| WO | WO-97-22152 | 6/1997 |
| WO | WO-98-09337 | 3/1998 |
| WO | WO-98-48079 | 10/1998 |
| WO | WO-00-16409 | 3/2000 |
| WO | WO-01-57932 | 8/2001 |
| WO | WO-02-089188 | 11/2002 |
| WO | WO-02-091482 | 11/2002 |
| WO | WO-03-058725 | 7/2003 |
| WO | WO-2004-033769 | 4/2004 |
| WO | WO 2004-099472 | 11/2004 |
| WO | WO-2005-096395 | 10/2005 |
| WO | WO-2005-104236 A2 | 11/2005 |
| WO | WO-2006-111804 | 10/2006 |
| WO | WO-2007-117034 | 10/2007 |
| WO | WO 2007-121619 | 11/2007 |
| WO | WO-2007-134843 | 11/2007 |
| WO | WO-2008-023265 | 2/2008 |

OTHER PUBLICATIONS

International Search Report and Written Opinion for PCT/US2006/033115, mailed Oct. 2, 2007.

Wilt et al., "GaAs Photovoltaics on Polycrystallline Ge Substrates," *Photovoltaic Energy Conversion, Conference Record of the 2006 IEEE 4th World Conference*, (May 2006) vol. 2, pp. 1891-1894.

International Search Report and Written Opinion for PCT/US2008/081984, mailed Apr. 28, 2010, 8 pages.

International Preliminary Report on Patentability for PCT/US2008/081984, mailed May 14, 2010, 5 pages.

Zhang et al., "Epitaxy of cubic boron nitride on (001)-oriented diamond," 2 Nature Materials, pp. 312-315 (May 2003).

Mauk et al., "Large-grain (>1-mm), recrystalized germanium films on alumina, fused silica, oxide-coated silicon substrate for II-V solar cell applications," J. Crystal Growth 250, pp. 50-56 (2003).

Ohmachi et al., "Zone-melting germanium film recrystalization with tungsten encapsulation," Applied Physics Letters 43(1), pp. 971-973 (Nov. 1983).

* cited by examiner

METHODS FOR FORMING CRYSTALLINE THIN-FILM PHOTOVOLTAIC STRUCTURES

CROSS-REFERENCE TO RELATED APPLICATION

This application claims priority to and the benefit of, and incorporates herein by reference in its entirety, U.S. Provisional Patent Application No. 60/984,796, which was filed on Nov. 2, 2007.

TECHNICAL FIELD

In various embodiments, the present invention relates to photovoltaic structures and devices, and in particular to thin-film photovoltaics.

BACKGROUND

Both the alternative-energy and flat-panel display markets have a need for high-quality, flexible substrates on which to produce highly crystalline semiconductor thin films.

The current solar cell (i.e., photovoltaic) market relies on technology that has been essentially unchanged for decades. Over 90% of the market is served by crystalline silicon (Si), either single-crystal or polycrystalline, with average conversion efficiencies of 12-20%. The costs of crystalline Si devices are high due to high-cost production methods and high demand for the raw materials in competition with the semiconductor electronics industry. Si devices must also be quite thick to achieve these efficiencies, consuming significant quantities of material. The remaining 10% of the market is served largely by thin-film structures based on amorphous Si, CdTe, or copper-indium-gallium-selenide ("CIGS") that are cheaper to produce but have energy conversion efficiencies below 10%. Amorphous Si efficiencies also degrade with time.

Higher conversion efficiencies, over 30%, have been demonstrated for thin film multi-junction devices based on III-V semiconductors such as GaAs. However, their production costs are very high since these devices are most advantageously grown on single-crystal germanium (Ge) or GaAs wafers costing over $10,000 per square meter.

Emerging low-cost photovoltaic technologies include ribbon-grown Si, polymeric/organic films, and nanotechnology-based approaches. None of these new solutions fully addresses the market needs for increased production volume, increased efficiency, and lower cost per watt generated.

A useful substrate for the growth of high efficiency semiconductor films (e.g., III-V semiconductor films) preferably enables the growth of low-defect films (similar to those formed on single-crystal wafers) but at much lower cost and with higher area. Flexibility is a useful attribute. The substrate is also preferably chemically compatible with both the semiconductor material and with the semiconductor process environment. These demanding attributes restrict the number of materials that may effectively be used for this application.

The ability to produce polycrystalline metals with crystallographic orientation (e.g., "biaxial texture") approaching single-crystal quality in pure metals has been known since the 1940's. Practical applications of such texture control have included the production of aluminum sheet with textures that enhance the production of cans. Most commercial uses of sheet materials avoid texture, however, because the properties of sheet materials are more isotropic in its absence.

Face-centered cubic (fcc) metals, some body-centered cubic (bcc) metals, and some alloys based on fcc metals may be useful as substrate materials, as they may be biaxially textured using well-known rolling-deformation and annealing processes. A well-known texture in fcc metals and alloys is the "cube texture," in which the c-axis of each of the substrate grains is substantially perpendicular to the substrate surface, and the a-axes align primarily along a length direction. Under controlled rolling and annealing processes, these deformation-textured metals may possess biaxial texture approaching that of single crystals.

Nickel (Ni) is one fcc metal that may be made into thin foils with a well-defined cube texture using a rolling and annealing process. Prior work has shown that oxide intermediate layers may be deposited on a biaxially textured Ni surface using conditions under which nickel oxide is not stable, but where the intermediate layer (for example, $CeO_2$ or $Y_2O_3$) is stable, allowing the oxide to inherit the texture of the underlying Ni foil, i.e., form epitaxially thereon. The high-purity Ni required to achieve good biaxial texture is expensive and Ni is mechanically weak following the typical annealing heat treatment used to form the cube texture.

For these reasons, Ni alloys and other alloys have been developed to make stronger, non-magnetic biaxially textured foils. These alloys often contain alloying elements such as tungsten (W), molybdenum (Mo), vanadium (V), or chromium (Cr) in small controlled amounts. Relatively pure copper (Cu) may also be processed to produce a high-quality cube texture. Commercial grades of Cu with relatively low oxygen content and relatively low content of substitutional and interstitial elements have been of particular utility. In addition, prior work has shown that a wide range of Ni—Cu alloys may also be processed to produce high-quality cube textures.

Epitaxial films of other materials such as metals, oxides and nitrides can be grown on the biaxially textured foil. As used herein, "epitaxial" means that the crystallographic orientation of the deposited film is derived from and directly related to the crystallographic orientation of the underlying template.

Unfortunately, the existing deformation-textured foil approach is frequently not commercially viable for the deposition of semiconducting films necessary for high-performance optical and photovoltaic devices, e.g., Si, Ge, GaAs, InP, and related alloys and compounds. One promising approach utilizing Cu or Cu—Ni alloy textured foils is described in U.S. Patent Application Publication No. 2007/0044832A1, the entire disclosure of which is incorporated by reference herein. However, such foils may be incompatible with conventional semiconductor processes. Both Cu and Ni form arsenide and silicide phases when exposed to As- or Si-containing gases at typical processing temperatures above approximately 350° C. The formation of these phases causes a significant increase in volume, embrittles the foils, and renders the foils largely unusable for subsequent processing and for most applications.

Thus, while considerable progress has been made in the use of biaxially textured foils for superconductor applications, there is a need for processes and structures for non-superconductor materials and applications such as optical devices, optoelectronic devices, and photovoltaics.

SUMMARY

The foregoing limitations of conventional thin-film photovoltaic platforms and fabrication processes are herein addressed by removing a highly textured template layer after a buffer layer has "inherited" a texture therefrom but before the formation of semiconductor layers. The template layer is thereby utilized to create a texture suitable for the subsequent fabrication of high-quality semiconductor materials and devices, but is removed before exposure to processes tending to embrittle the template layer.

In one aspect, embodiments of the invention feature a method for forming a semiconductor device. The method includes providing a textured template, forming a buffer layer over the textured template, forming a substrate layer over the buffer layer, removing the textured template (thereby exposing a surface of the buffer layer), and forming a semiconductor layer over the exposed surface of the buffer layer. During formation of the buffer layer, the buffer layer may inherit the texture of the textured template (such that the texture is revealed on the exposed surface). A sacrificial layer, which may include or consist essentially of Pd, may be formed over the textured template prior to forming the buffer layer. During formation of the sacrificial layer, the sacrificial layer may inherit the texture of the textured template. The sacrificial layer may be removed during removal of the textured template.

The method may include forming an insulator layer over the buffer layer prior to forming the substrate layer. The insulator layer may include or consist essentially of an oxide, and/or may be amorphous. A diffusion barrier, which may be substantially free of the texture of the textured template, may be formed over the buffer layer prior to forming the substrate layer. The diffusion barrier may include or consist essentially of a metal or metal alloy such as W or Re, and/or may include or consist essentially of an oxide or a nitride. The diffusion barrier may include or consist essentially of W.

The substrate layer may include or consist essentially of at least one of W, Mo, a metal alloy, a ceramic, or a glass. The substrate layer may include or consist essentially of a material substantially impervious to the formation of As-containing phases and/or Si-containing phases at a temperature greater than approximately 350° C. The substrate layer may be substantially free of the texture of the textured template. The semiconductor layer may include or consist essentially of at least one of Si, Ge, or InGaAs. The coefficient of thermal expansion of the substrate layer may substantially match the coefficient of thermal expansion of the semiconductor layer. The buffer layer may include or consist essentially of at least one of Cr, an oxide, or a nitride. The textured template may include or consist essentially of at least one of Cu, Ni, or a Cu—Ni alloy.

The semiconductor layer may include or consist essentially of at least one of a p-n junction or a p-i-n junction, and a semiconductor device may be formed on the semiconductor layer. The semiconductor device may include or consist essentially of at least one of GaAs, AlGaAs, InGaP, InGaAsN, InGaAsP, InP, AlInAs, InGaAs, or alloys or mixtures thereof. The semiconductor device may include at least one of a photovoltaic cell, a light-emitting diode, or a laser. The substrate layer may function as a back contact for the semiconductor device.

In another aspect, embodiments of the invention feature a semiconductor structure including a substantially untextured substrate layer, a textured buffer layer disposed over the substrate layer, and a semiconductor layer disposed over the textured buffer layer. The grain size of the textured buffer layer and/or the semiconductor layer may be greater than approximately 25 μm. The textured buffer layer may include or consist essentially of a metal or a metal alloy, e.g., Cr. The textured buffer layer may include or consist essentially of at least one of an oxide or a nitride.

The structure may include a diffusion barrier disposed between the substrate layer and the textured buffer layer. The diffusion barrier may include or consist essentially of a metal or a metal alloy, e.g., at least one of W or Re. The diffusion barrier may include or consist essentially of at least one of an oxide or a nitride.

The structure may include an insulator layer disposed between the substrate layer and the textured buffer layer. The insulator layer may include or consist essentially of an oxide, and may be amorphous. The substrate layer may include or consist essentially of at least one of W, Mo, a metal alloy, a ceramic, or a glass. The coefficient of thermal expansion of the substrate layer may substantially match the coefficient of thermal expansion of the semiconductor layer.

The structure may include a semiconductor device disposed over the semiconductor layer. The semiconductor device may include or consist essentially of at least one of a photovoltaic cell, a light-emitting diode, or a laser. The semiconductor device may include or consist essentially of at least one of GaAs, AlGaAs, InGaP, InGaAsN, InGaAsP, InP, AlInAs, InGaAs, or alloys or mixtures thereof.

In yet another aspect, embodiments of the invention feature a semiconductor device including a substantially untextured flexible substrate layer and a plurality of textured semiconductor junctions disposed over the substrate layer. The device may include a textured buffer layer and/or an insulator layer disposed between the substrate layer and the plurality of semiconductor junctions. The plurality of semiconductor junctions may form a photovoltaic cell having an energy conversion efficiency greater than approximately 15%, or even greater than approximately 20%. The grain size of each of the semiconductor junctions may be larger than approximately 25 μm.

In another aspect, embodiments of the invention feature a structure including a textured template that itself includes or consists essentially of a first metal (or metal alloy); a buffer layer, disposed over the textured template, that includes or consists essentially of a second metal (or metal alloy) different from the first metal (or metal alloy); and a substantially untextured substrate layer, disposed over the buffer layer, that includes or consists essentially of at least one of a ceramic, a glass, or a third metal (or metal alloy) different from both the first and second metals (or metal alloys). The texture of the buffer layer may substantially match the texture of the textured template. The substrate layer may include or consist essentially of a material substantially impervious to formation of As-containing phases and/or Si-containing phases at a temperature greater than approximately 350° C. The textured template may include or consist essentially of a material that forms As-containing phases and/or Si-containing phases at a temperature greater than approximately 350° C.

The structure may include a substantially untextured diffusion barrier disposed between the buffer layer and the substrate layer. The diffusion layer may include or consist essentially of at least one of an oxide, a nitride, or a fourth metal (or metal alloy) different from the first, second, and third metals (or metal alloys). The structure may include a textured sacrificial layer including or consisting essentially of a fifth metal (or metal alloy) different from the first, second, third, and fourth metals (or metal alloys), e.g., Pd, disposed between the textured template and the buffer layer.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
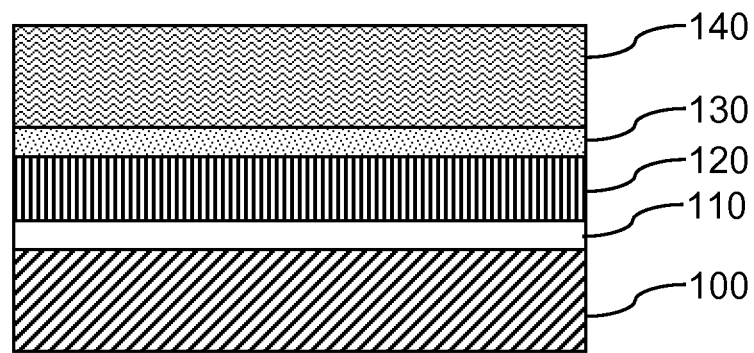
FIG. 1A is a schematic cross-sectional diagram of an exemplary structure formed on a textured template in accordance with various embodiments of the invention.

Templates suitable for use in embodiments of the present invention include crystallographically oriented material layers that are chemically compatible and are lattice-matched with known and anticipated semiconductor materials, in particular with compound semiconductors (e.g., III-V semiconductor materials). "Lattice-matched," as used herein, refers to layers or materials having relative lattice spacings that allow the epitaxial growth of one layer (e.g., a buffer) on the other (e.g., a template) with a controlled texture and an acceptable level of defects to enable the subsequent integration of high-quality semiconductor materials and/or high-efficiency semiconductor devices. For metallic films, lattice-matching may be within an approximately 10% relative difference in lattice spacing, preferably within approximately 5%, and more preferably within approximately 2%. The lattice spacing may refer to the material's unit-cell lattice constant as it is commonly defined in the art, or to another interatomic spacing that can be defined in reference to the lattice constant. For instance, the lattice constant of a material may be lattice-matched to the lattice spacing defined by the diagonal of a face of a cubic crystal (which is approximately equal to 1.414 times the lattice constant). Furthermore, a material having a lattice constant (or other lattice spacing) that is approximately an integral multiple (again, within approximately 10%, approximately 5%, or approximately 2%) of that of another material may also be considered to be "lattice matched." For example, a material having a lattice spacing approximately twice that of a second material will achieve approximate lattice registry with every other atom of the second material. The necessary degree of matching may depend on the type of material under consideration. For example, a high-quality semiconductor layer may require closer lattice-matching to an underlying layer than a metal layer deposited on another metal layer. Non-limiting examples of lattice-matching include Cr and palladium (Pd), which are matched to within approximately 8%, as well as the cube-face diagonal of Cr and one-half the cube-face diagonal of Ge, which are matched to within approximately 3%.

"Chemically compatible," as used herein, means that a material is not reactive with a semiconductor process environment and preferably is not reactive with and does not react with (at least at the processing temperatures contemplated herein) or contaminate a semiconductor material integrated thereon. Further, even if a reaction does occur, a chemically compatible material should not react with a semiconductor to the extent that it degrades the quality or performance of the semiconductor. As one non-limiting example of chemical compatibility, Ge and Cr may react to form a GeCr compound, but this compound is stable and does not affect the performance of either the Ge or other semiconductors formed atop the Ge.

As used herein, "texture" refers to a defined crystallographic orientation that extends throughout the thickness of a layer of material, as opposed to mere topology of a surface that does not extend through an entire thickness. As used herein, "biaxial" refers to crystal grains in the substrate or film in close alignment with both a direction perpendicular to the surface of the film and a direction in the plane of the film. Biaxial texturing allows for the production of a low volume of point and line defects in a semiconducting film, and minimizes the carrier-trapping effects of high-angle grain boundaries. This enables very high current densities in these films at typical device operating conditions. "Untextured," as utilized herein refers to materials that lack texture (as defined above), e.g., materials having randomly oriented crystal grains or that are amorphous.

Referring to FIG. 1A, a textured template 100 is provided by, e.g., deformation rolling and annealing processes known in the art. Textured template 100 may be in the form of a thin foil, and may have a thickness between approximately 10 micrometers (μm) and approximately 100 μm, e.g., approximately 25 μm. A surface of textured template 100 may be polished, e.g., to mirror smoothness. Textured template 100 may include or consist essentially of a metal or a metal alloy, e.g., Cu, Ni, a Cu alloy, and/or a Ni alloy. Textured template 100 has a defined texture, e.g., a biaxial texture such as a cube texture. Preferably the textured template 100 will exhibit, upon measurement by x-ray diffraction pole figure analysis, a full-width-half-maximum (FWHM) texture spread less than approximately 10 degrees, and preferably less than approximately 5 degrees. In some embodiments, textured template 100 has a grain size greater than approximately 25 μm, preferably greater than approximately 50 μm, and even more preferably greater than approximately 100 μm. Textured template 100 may not be chemically compatible with semiconductor materials such as Ge, Si, and III-V semiconductors at typical processing temperatures above approximately 350° C. In certain embodiments, textured template 100 includes or consists essentially of a material that forms As-containing phases and/or Si-containing phases at temperatures greater than approximately 350° C. upon exposure to precursors or other materials containing As and/or Si.

Optionally, a sacrificial layer 110 is formed over textured template 100. Sacrificial layer 110 may include or consist essentially of a metal or a metal alloy, e.g., Pd, platinum (Pt), aluminum (Al), or silver (Ag), or may include or consist essentially of an element or compound enabling improved lattice matching between textured template 100 and buffer layer 120 (described below), e.g., a material having a lattice spacing therebetween. Sacrificial layer 110 may be formed by deposition, e.g., evaporation, sputtering, chemical vapor deposition, atomic layer deposition, molecular beam epitaxy, metallorganic deposition, or by electrochemical means such as electroplating (with or without electrodes). During formation, sacrificial layer 110 "inherits" the texture of textured template 100, i.e., forms with such atomic registry as to replicate the texture through its thickness. The "inheritance" of an underlying texture may provide superior texture through a thickness of a layer when compared to, e.g., a layer formed via ion-beam assisted deposition on a substantially untextured substrate (while small-range texturing and small grains (i.e., less than 1 µm in size) may develop in such layers, they will generally lack consistent texturing through their entire thicknesses). Formation of sacrificial layer 110 may be performed without ion-beam assistance. During subsequent processing of textured template 100, sacrificial layer 110 may substantially react with or diffuse into textured template 100. Sacrificial layer may have a thickness of, e.g., less than approximately 200 nm, e.g., less than approximately 100 nm, or even less than approximately 50 nm.

A buffer layer 120 is formed over textured template 100 and optional sacrificial layer 110. Buffer layer 120 may include or consist essentially of a metal or a metal alloy, e.g., Cr, or may include or consist essentially of a nitride or an oxide. Such an oxide may be a compound consisting essentially of oxygen and at least one non-metallic element, e.g., Si. Buffer layer 120 may have a thickness of, e.g., between approximately 100 nm and approximately 500 nm, e.g., approximately 200 nm. Buffer layer 120 may be formed by deposition, e.g., evaporation, sputtering, chemical vapor deposition, atomic layer deposition, molecular beam epitaxy, metallorganic deposition, or by electrochemical means such as electroplating (with or without electrodes). During formation, buffer layer 120 inherits the texture of textured template 100. Buffer layer 120 may be provided without ion-beam assistance. In some embodiments, multiple buffer layers 120 may be formed over textured template 100.

An optional diffusion barrier 130 is formed over buffer layer 120. Diffusion barrier 130 may be formed substantially non-epitaxially and thus be substantially lacking the texture of buffer layer 120 and textured template 100. Diffusion barrier 130 may include or consist essentially of a metal or a metal alloy, e.g., W or rhenium (Re), or may include or consist essentially of a nitride or an oxide, e.g., a compound consisting essentially of oxygen and at least one non-metallic element such as Si. Diffusion barrier 130 prevents substantially all interdiffusion or reaction between substrate layer 140 and semiconductor materials and devices formed over buffer layer 120 (as further described below).

In addition to or instead of diffusion barrier 130, an insulator layer (not shown), e.g., a dielectric or other electrical insulator, may be formed over buffer layer 120. The insulator layer may be amorphous, and may include or consist essentially of an oxide, e.g., a compound consisting essentially of oxygen and at least one non-metallic element such as Si. In an embodiment, the insulator layer may include or consist essentially of a nitride or aluminum oxide. The insulator layer may be formed by deposition, e.g., evaporation, sputtering, chemical vapor deposition, atomic layer deposition, or molecular beam epitaxy, and may be formed without ion-beam assistance. The insulator layer may provide electrical insulation between substrate layer 140 and subsequently formed semiconductor materials and devices (as further described below).

A substrate layer 140 is formed over buffer layer 120 and optional diffusion barrier 130 (and/or the insulator layer, if present). Substrate layer 140 provides structural support to semiconductor materials and devices formed over buffer layer 120 after removal of textured template 100 (as further described below), and is preferably chemically compatible with semiconductor materials such as Ge, Si, and III-V semiconductors at typical processing temperatures above approximately 350° C. In a preferred embodiment, substrate layer 140 includes or consists essentially of a material substantially impervious to formation of As-containing phases and/or Si-containing phases at temperatures greater than approximately 350° C. Substrate layer 140 may be formed substantially non-epitaxially and thus be substantially lacking the texture of buffer layer 120 and textured template 100. Therefore, substrate layer 140 may be formed by any method known in the art, e.g., vacuum deposition, chemical vapor deposition, heat lamination, electrodeposition, slurry coating, metallorganic deposition, or lamination. In the case of lamination, the laminating agent such as, for example, a braze alloy or adhesive, should also be chemically compatible and thermally stable with any subsequent semiconductor processes. In an embodiment, substrate layer 140 is formed by electron-beam evaporation at a temperature greater than approximately 900° C. Substrate layer 140 may include or consist essentially of a composite, a ceramic (e.g., alumina and/or zirconia), a glass, a metal alloy, or a metal, e.g., W, Mo, and/or Al. In an embodiment, substrate layer 140 includes or consists essentially of a metal coated with a thicker ceramic material for additional structural support. In various embodiments, substrate layer 140 is flexible and thus capable of being manipulated into non-planar configurations. Substrate layer 140 may be substantially electrically conductive, enabling it to function as a contact, e.g., a back contact, for a subsequently formed semiconductor device. Substrate layer 140 may have a thickness of, e.g., between approximately 1 µm and approximately 0.5 mm.

Figure 1B:
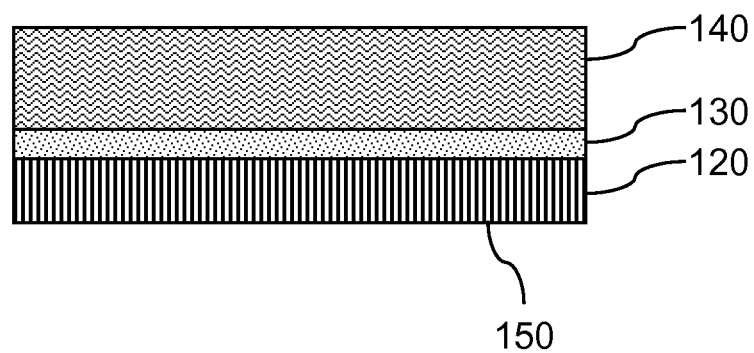
FIG. 1B is a schematic diagram of the structure of FIG. 1A after removal of the textured template.

Referring to FIG. 1B, textured template 100 (and optional sacrificial layer 110, if present) is removed, exposing surface 150 of buffer layer 120. Textured template 100 may be removed by a selective process and/or with end-point monitoring. As utilized herein, a selective process will remove substantially all of textured template 100 without adversely affecting surface 150, thereby rendering surface 150 suitable for the subsequent formation of semiconductor materials and/or devices thereon. Suitable selective processes may include, e.g., chemical etching (with, e.g., an acid such as nitric acid), electrochemical etching, plasma etching, ion-beam bombardment, laser ablation, melting, and reverse-bias sputtering. Suitable end-point monitoring methods may include, e.g., surface reflectance, residual-gas analysis, optical-absorption spectroscopy, and other methods known in the art to be capable of detecting the substantially complete removal of textured template 100. Optionally, the exposed surfaces of substrate layer 140 may be protected from damage or removal by a protective layer (not shown) during removal of textured template 100. The texture of buffer layer 120 (inherited from textured template 100), and thus, surface 150, remains substantially unchanged after removal of textured template 100.

Figure 2:
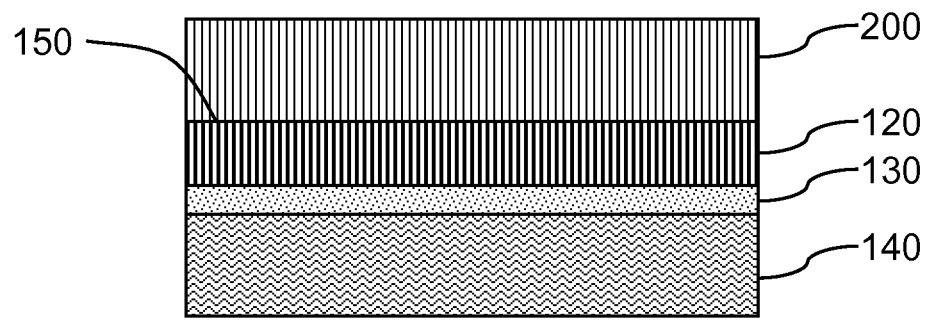
FIGS. 2-4 are schematic diagrams of the structure of FIG. 1B after further deposition and processing in accordance with various embodiments of the invention.

Referring to FIG. 2, at least one semiconductor layer 200 is formed over surface 150 of buffer layer 120. Buffer layer 120 and semiconductor layer 200 are preferably lattice-matched and chemically compatible. Semiconductor layer 200 may include or consist essentially of at least one group IV element or compound (e.g., Si, Ge, or SiGe), or a III-V compound (e.g., a compound including a combination of Al, Ga, In, As, P, and/or N), and may be doped (i.e., include n-type and/or p-type dopants). In a preferred embodiment, semiconductor layer 200 includes or consists essentially of at least one of Si, Ge, or InGaAs. Semiconductor layer 200 may inherit the texture of buffer layer 120 and may be substantially crystallographically oriented; the orientation may be, e.g., (100), (110), or (111). Semiconductor layer 200 may be formed by deposition, e.g., chemical vapor deposition, atomic layer deposition, molecular beam epitaxy, liquid phase epitaxy, or physical vapor deposition, at a deposition temperature between approximately 25° C. and approximately 700° C. The thickness of semiconductor layer 200 may be between approximately 100 nm and approximately 5 µm, e.g., approximately 2 µm. In an embodiment, semiconductor layer 200 is doped to form a p-n junction and/or a p-i-n junction therein. Such a junction may function as part of a subsequently fabricated semiconductor device (as described further below). Semiconductor layer 200 may include or consist essentially of at least one homojunction or of at least one heterojunction (incorporating multiple semiconductor materials, e.g., forming a quantum well of one material "sandwiched" between layers of another material).

In a preferred embodiment, coefficients of thermal expansion of semiconductor layer 200 (and/or subsequently formed semiconductor materials and devices) and substrate layer 140 are substantially matched, thus enabling the fabrication of semiconductor materials and devices substantially free of deleterious residual stresses and/or cracks. According to various embodiments of the invention, substantially matched coefficients of thermal expansion have a relative difference of less than approximately 20%, preferably less than approximately 10-15%, and even more preferably less than approximately 5%. For example, a coefficient of thermal expansion of Mo is approximately $4.8 \times 10^{-6}/° C.$, matched to within approximately 15% of that of Ge or GaAs (approximately $5.7 \times 10^{-6}/° C.$).

Figure 3:
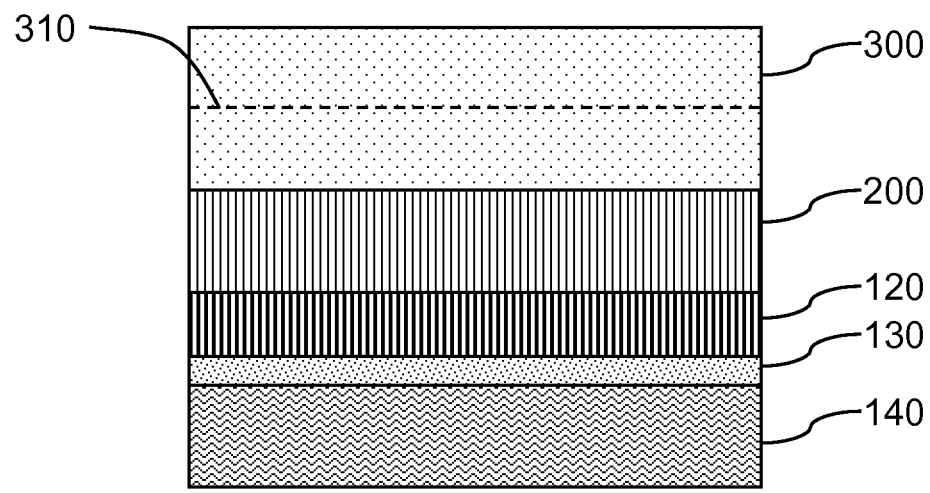

Referring to FIG. 3, in various embodiments of the invention, a semiconductor device 300 is formed over semiconductor layer 200. Semiconductor device 300 may include or consist essentially of a photovoltaic cell (see also, e.g., FIG. 4), a light-emitting diode, a laser, or a display. Semiconductor device 300 may include or consist essentially of a III-V compound (e.g., a compound including a combination of Al, Ga, In, As, P, and/or N), and may be doped (i.e., include n-type and/or p-type dopants). In an embodiment, semiconductor device 300 includes or consists essentially of at least one of GaAs, AlGaAs, InGaP, InGaAsN, InGaAsP, InP, AlInAs, or InGaAs. Semiconductor device 300 may be doped to form at least one p-n junction and/or p-i-n junction. In FIG. 3, boundary 310 represents the approximate boundary between p- and n-type doped regions in a p-n junction or the intrinsic region in a p-i-n junction. Semiconductor device 300 may be lattice-matched to semiconductor layer 200, and may have a texture substantially equal to that of semiconductor layer 200. Semiconductor device 300 may include or consist essentially of at least one homojunction or of at least one heterojunction.

Figure 4:
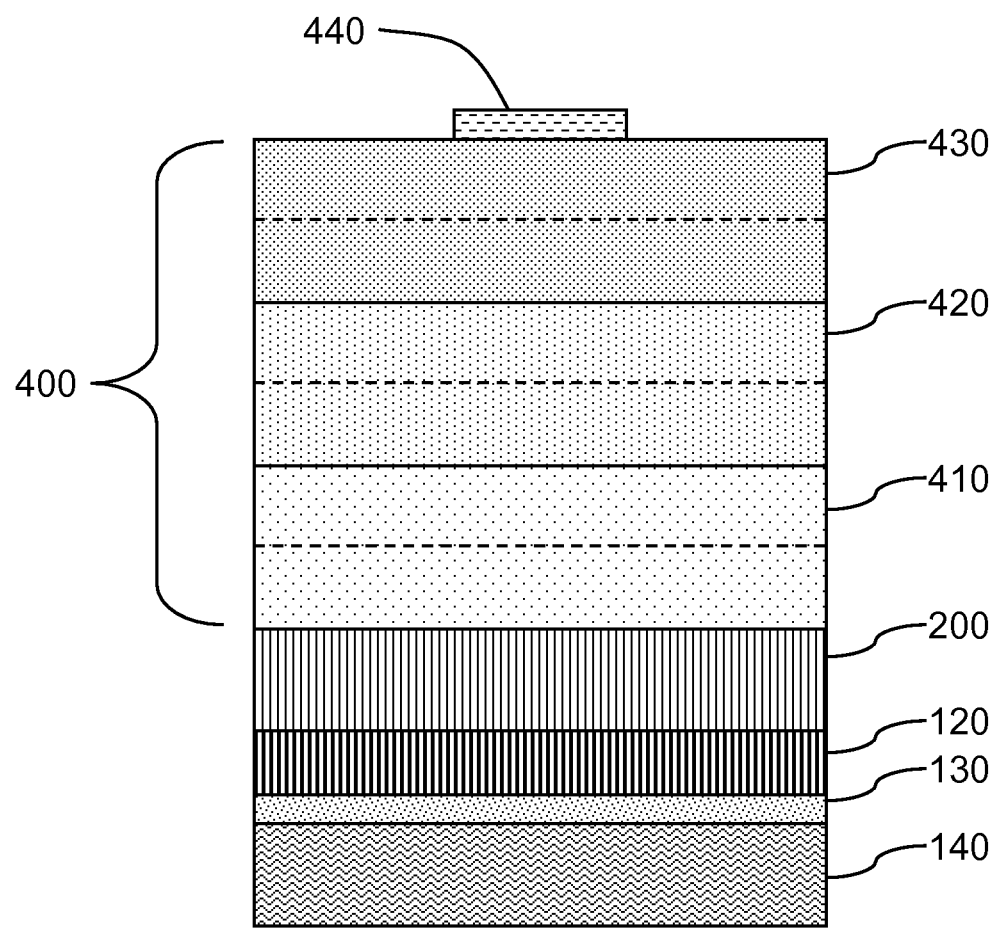

FIG. 4 illustrates a multijunction photovoltaic cell 400 formed over semiconductor layer 200. Cell 400 includes a plurality of p-n or p-i-n junctions; three such junctions 410, 420, 430 are depicted in FIG. 4. Each of the junctions may have a different bandgap; thus, each junction may absorb light of a different wavelength, increasing the overall efficiency of cell 400. The intrinsic layer in a p-i-n junction may decrease dark current of cell 400 (or a junction therein) by substantially preventing the formation of current leakage paths from the p-type doped layer to the n-type doped layer (or vice versa) along grain boundaries in one or more of the layers. One or more of the semiconductor materials in cell 400 may be substantially lattice-matched to semiconductor layer 200, and semiconductor layer 200 may include a p-n or p-i-n junction (and thus form an active portion of the device, as mentioned above). A top contact 440, which may include or consist essentially of, e.g., a metal or a transparent conductor (such as indium tin oxide), may be formed to enable electrical contact to cell 400. Substrate layer 140 may function as a back contact to cell 400. In structures containing an optional insulator layer over substrate layer 140, the insulator layer may provide isolation between multiple semiconductor devices 300 and/or cells 400 formed over a common substrate layer 140. Cell 400 (and/or other semiconductor devices 300) may exhibit energy conversion efficiencies greater than approximately 15%, greater than approximately 20%, or even greater than approximately 30% under one-sun terrestrial illumination conditions. The devices may exhibit greater than 80% of the energy conversion efficiencies of substantially similar devices fabricated over single-crystal semiconductor substrates.

The layer and/or device fabrication processes described herein may be practiced in a conventional batch or single-wafer process or by a roll-to-roll continuous or stepwise manufacturing method. The resulting devices may have surface areas greater than approximately 115 $cm^2$. Roll-to-roll processes may take place in a continuous system in which each step of the process is performed, or in a series of systems, each of which performing one or more of the steps in the process. A roll-to-roll process (or processes) may include or consist essentially of deposition of sacrificial layer 110, buffer layer 120, diffusion layer 130, and one or more semiconductor layers 200. A roll-to-roll process may also include the removal of textured template 100. Moreover, devices and materials utilized in accordance with embodiments of the present invention may be substantially non-superconducting.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for forming a semiconductor device, the method comprising:
   providing a textured polycrystalline metal template;
   forming a buffer layer over the textured template;
   forming a substrate layer over the buffer layer;
   removing the textured template, thereby exposing a surface of the buffer layer; and
   forming a semiconductor layer over the exposed surface of the buffer layer.

2. The method of claim 1, wherein, during formation of the buffer layer, the buffer layer inherits the texture of the textured template.

3. The method of claim 2, wherein the texture appears on the exposed surface of the buffer layer.

4. The method of claim 1, further comprising forming a sacrificial layer over the textured template prior to forming the buffer layer.

5. The method of claim 4, wherein, during formation of the sacrificial layer, the sacrificial layer inherits the texture of the textured template.

6. The method of claim 4, further comprising removing the sacrificial layer during removal of the textured template.

7. The method of claim 4, wherein the sacrificial layer comprises Pd.

8. The method of claim 1, further comprising forming an insulator layer over the buffer layer prior to forming the substrate layer.

9. The method of claim 8, wherein the insulator layer comprises an oxide.

10. The method of claim 1, further comprising forming a diffusion barrier over the buffer layer prior to forming the substrate layer.

11. The method of claim 10, wherein the diffusion barrier is substantially free of the texture of the textured template.

12. The method of claim 10, wherein the diffusion barrier comprises at least one of W, Re, an oxide, or a nitride.

13. The method of claim 12, wherein the diffusion barrier comprises W.

14. The method of claim 1, wherein the substrate layer comprises at least one of W, Mo, a metal alloy, a ceramic, or a glass.

15. The method of claim 1, wherein the substrate layer comprises a material substantially impervious to formation of at least one of As-containing phases or Si-containing phases at a temperature greater than approximately 350° C.

16. The method of claim 1, wherein the substrate layer is substantially free of the texture of the textured template.

17. The method of claim 1, wherein the semiconductor layer comprises at least one of Si, Ge, or InGaAs.

18. The method of claim 1, wherein a coefficient of thermal expansion of the substrate layer substantially matches a coefficient of thermal expansion of the semiconductor layer.

19. The method of claim 1, wherein the buffer layer comprises at least one of Cr, an oxide, or a nitride.

20. The method of claim 1, wherein the textured template comprises at least one of Cu, Ni, or a Cu—Ni alloy.

21. The method of claim 1, wherein the semiconductor layer comprises at least one of a p-n junction or a p-i-n junction.

22. The method of claim 1, further comprising forming a semiconductor device on the semiconductor layer.

23. The method of claim 22, wherein the semiconductor device comprises at least one of GaAs, AlGaAs, InGaP, InGaAsN, InGaAsP, InP, AlInAs, or InGaAs.

24. The method of claim 22, wherein the semiconductor device comprises at least one of a photovoltaic cell, a light-emitting diode, or a laser.

25. The method of claim 22, wherein the substrate layer functions as a back contact for the semiconductor device.

26. The method of claim 1, wherein the buffer layer and the substrate layer are each formed by deposition.

27. The method of claim 26, wherein the deposition is performed without ion-beam assistance.

28. The method of claim 1, wherein the buffer layer is a polycrystalline metal.

29. The method of claim 28, wherein the semiconductor layer is formed directly on the exposed surface of the buffer layer.

30. The method of claim 1, wherein the textured template is deformation textured.

* * * * *